United States Patent [19]
Masuda et al.

[11] 3,816,826
[45] June 11, 1974

[54] KEYBOARD SWITCH APPARATUS

[75] Inventors: Noboru Masuda, Saitama; Masasi Kuroyanagi, Tokyo; Takashi Matukawa, Kanagawa, all of Japan

[73] Assignee: Denki Onkyo Co., Ltd., Tokyo, Japan

[22] Filed: June 25, 1973

[21] Appl. No.: 372,928

[30] Foreign Application Priority Data

June 23, 1972 Japan .............................. 47-63602
Aug. 11, 1972 Japan .............................. 47-80424

[52] U.S. Cl. ...... 340/365 E, 340/365 A, 340/365 L
[51] Int. Cl. .......................................... H04l 15/06
[58] Field of Search ......... 340/365 A, 365 L, 365 E

[56] References Cited

UNITED STATES PATENTS

| | | | |
|---|---|---|---|
| 3,493,928 | 2/1970 | Juliusburger | 340/365 E |
| 3,582,892 | 6/1971 | Juliusburger | 340/365 E |
| 3,731,074 | 5/1973 | Masuda | 340/365 L |

*Primary Examiner*—Thomas B. Habecker
*Attorney, Agent, or Firm*—Armstrong, Nikaido & Wegner

[57] ABSTRACT

A keyboard switch apparatus which is adapted so that the switching means arranged in the matrix are actuated by operation of the switch circuits which are actuated by the keys, wherein each of said switch circuits is provided with a single auxiliary switch circuit which gives a hysteresis characteristic to said switch circuits.

16 Claims, 22 Drawing Figures

KEYBOARD SWITCH APPARATUS

BACKGROUND OF THE INVENTION

The present invention relates to a keyboard switch apparatus which is employed in an input unit of an electronic computer, etc.

Generally, the terminal equipment of an electronic computer employs a keyboard switch apparatus having 60 to 90 switches. These switches form a matrix of m lines and n rows, that is, a matrix of lines $X_1$, $X_2$, $X_3$, —, $X_{m-1}$ and $X_m$ and rows $Y_1$, $Y_2$, $Y_3$, —, $Y_{n-1}$ and $Y_n$. Each switch is connected to switch over each line and row as shown in FIGS. 18 and 19. For example, when a switch between line $X_2$ and row $Y_2$ is closed, line $X_2$ and row $Y_2$ are shorted, or the output of line $X_2$ of ring counter 101 and the input of row $Y_2$ of comparator 102 are shorted. When the level of a pulse which is input into the comparator by this shorting matches with the level of a signal which is input from ring counter 103 into the comparator, comparator 103 sends a match confirming signal to clock control 104 and delay circuit 105. Clock control 104 stops the clock signal of ring counters 101 and 103 and stabilizes data output 112 with the specified bits. In this case, the addresses of read only memory (ROM) 106 are defined in accordance with combinations of ring counters 101 and 103 and shift input 107 and control input 108, and the memory sends the bit signals determined by the switches to output driver 109, from which data output 112 is obtained only when data strobe input 111 is input. This data output 112 is effective only when strobe output 110 is output.

Accordingly, the keyboard switch apparatus requires the switch matrix having the switches which are provided respectively each line of lines $X_1$, $X_2$, —, $X_m$ with m number of lead terminals and each row of rows $Y_1$, $Y_2$, —, $Y_n$ with n number of lead terminals and the strobe signal generating circuit.

Since the keyboard switch generally employs light small key switches, the key switches vibrate when the key is depressed, the threshold potential of the key switch circuit varies and the so-called chattering occurs. Each key switch circuit requires the hysteresis characteristic to prevent the chattering. The keyboard switch apparatus can be large in size by providing the hysteresis characteristic for each key switch circuit.

The present invention provides an extremely simplified keyboard switch apparatus in which each key switch circuit is provided with the hysteresis characteristic and a strobe signal can be simultaneously generated.

SUMMARY

A keyboard switch apparatus comprising: at least one switch circuit group which contains a plurality of switch circuits, each being comprised of the semiconductor resistance varying element such as, for example, magnetro-resistance effect device and the active element such as, for example, transistor which operates with variation of the internal resistance value of said magnetro-resistance effect device and providing output voltage which varies with variation of the resistance of said semiconductor resistance varying element; the first power supply which energizes said switch circuits; a plurality of key switch means, each of which is adapted so as to vary the resistance value of said semiconductor resistance varying element when said key switch means is manually operated, such as, for example, the key switch which is adapted so that the intensity of magnetic field applied to said magnetroresistance effect device varies with depression of said key switch; the switching means which performs switching operation in accordance with variation of the output voltage of said switch circuits, such as, for example, MOS type transistors which are arranged in a matrix format; and at least one auxiliary switch circuit, which has at least one active element such as a transistor, is connected to each switch circuit of said switch circuit group and operates so as to provide the hysteresis characteristic for variation of the output voltage of each switch circuit, such as, for example, a single auxiliary switch circuit in which the emitter of said transistor is connected in parallel with the emitters of the transistors of said all switch circuits and these emitters are grounded through a common emitter resistor.

BRIEF DESCRIPTION OF THE DRAWINGS

The present invention is illustrated in detail by the accompanying drawings whereon.

DETAILED DESCRIPTION OF THE INVENTION

Figure 1:
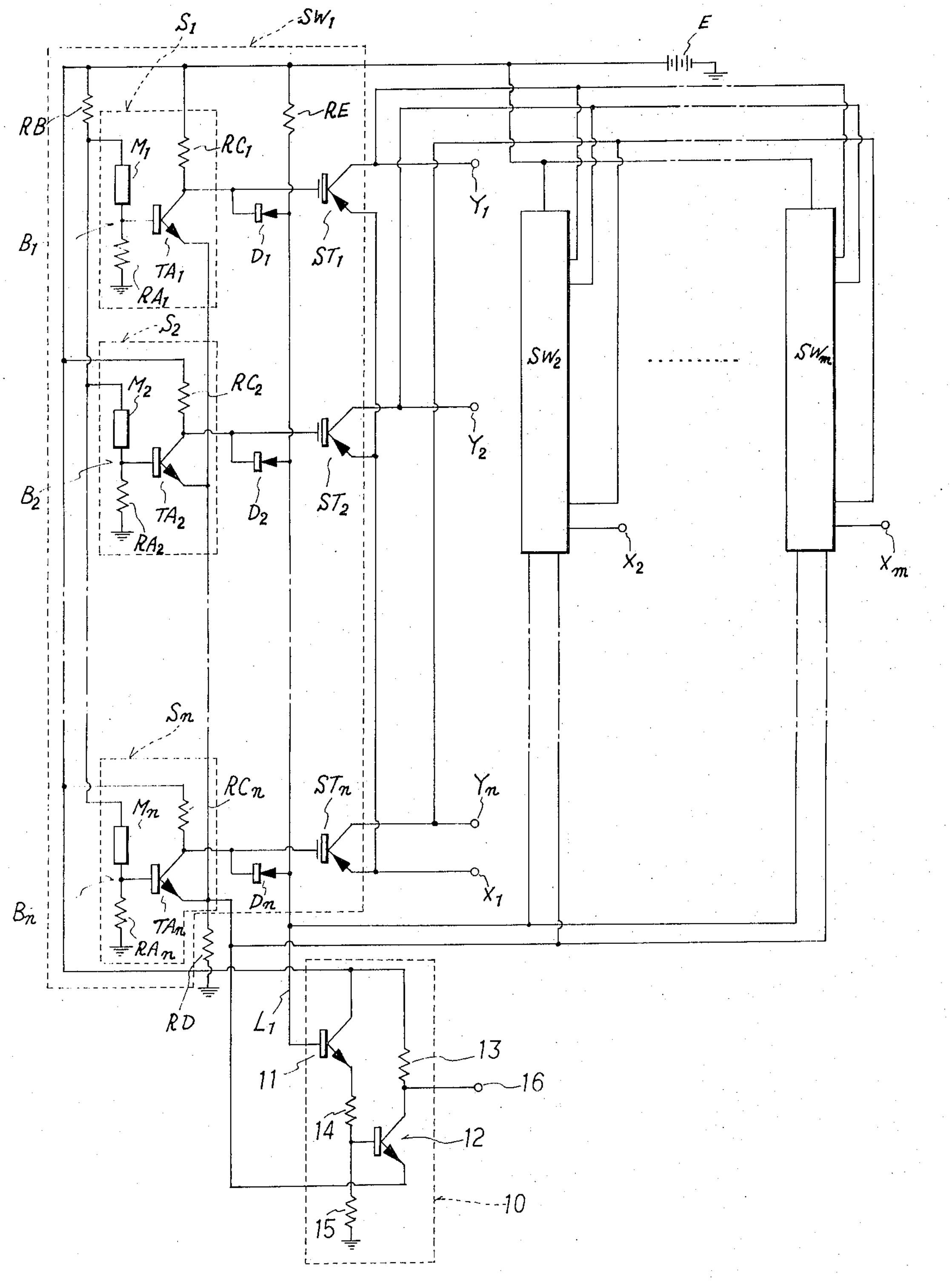
FIG. 1 is a partly omitted circuit diagram of the apparatus in accordance with the present invention.

Referring to FIG. 1, there is shown a partial circuit of an apparatus in accordance with the present invention.

Figure 18:
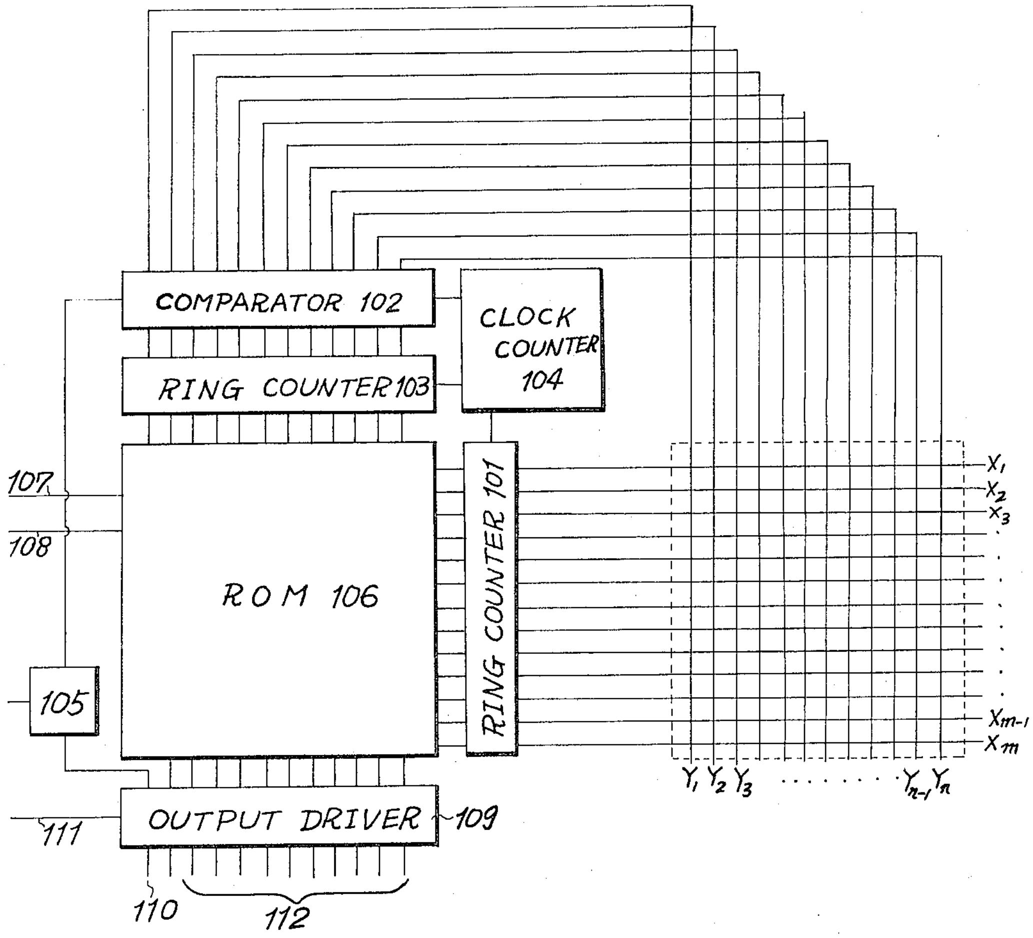
FIG. 18 is a block diagram showing a circuit configuration of the terminal equipment employing a switch matrix.
Figure 19:
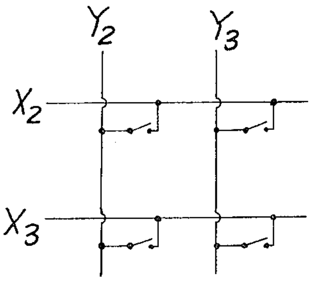
FIG. 19 is a view of a model of the switch of the switch matrix.

Switch assembly $SW_1$ comprising switch circuits $S_1$, $S_2$, —, $S_n$ and switching means $ST_1$, $ST_2$, —, $ST_n$ which open and close according to operation of said switch circuits correspond to the switches from row $Y_1$ to row $Y_n$ of line $X_1$ shown in FIG. 18.

NPN type transistors $TA_1$, $TA_2$, —, $TA_n$ form respectively switch circuits $S_1$, $S_2$, —, $S_n$. Bias circuits $B_1$, $B_2$, —, $B_n$ to which semiconductor resistance varying elements $M_1$, $M_2$, —, $M_n$ such as, for example, magnetro-resistance effect devices whose internal resistance varies in accordance with variation of the intensity of the applied magnetic field, photoelectric elements whose internal resistance varies in accordance with variation of the quantity of light which said elements receive or pressure sensing elements whose internal resistance varies in accordance with variation of the pressure and fixed resistors $RA_1$, $RA_2$, —, $RA_n$ are respectively series-connected are connected to the bases of said transistors. The bias circuits are connected in parallel and are connected to power supply E through common current limiting resistor RB. The collectors of said transistors are connected to power supply E through collector load resistors $RC_1$, $RC_2$, —, $RC_n$ and the reference electrodes, that is, the emitters of said transistors are connected in parallel and are grounded through common emitter resistor RD.

In said bias circuit, the fixed resistor is connected to the grounding side. Therefore, increase of the resistance value of the semiconductor resistance varying elements results in decrease of the bias potential of the bases of the transistors and decrease of said resistance value results in increase of said bias potential.

The collectors of transistors $TA_1$, $TA_2$, —, $TA_n$ are connected respectively to switching means $ST_1$, $ST_2$, —, $ST_n$ such as MOS transistors or bipolar transistors. The drains of MOS transistors $ST_1$, $ST_2$, —, $ST_n$ are respectively connected to input lead terminals $Y_1$, $Y_2$, —, $Y_n$ of comparator 102 shown in FIG. 18 and the sources are connected to lead terminal $X_1$ of ring counter 101. In other words, these switching means perform switching of switches from row $Y_1$ to row $Y_n$ of line $X_1$.

The collectors of transistors $TA_1$, $TA_2$, —, $TA_n$ are connected to common connection line $L_1$ through diodes $D_1$, $D_2$, —, $D_n$. This common connection line is connected power supply E through resistor RE and to auxiliary switch circuit 10.

Thus, switch assembly $SW_1$ corresponding to lead terminal $X_1$ is formed and other switch assemblies $SW_2$, $SW_3$, —, $SW_m$ related to lead terminals $X_2$, $X_3$, —, $X_m$ are similarly formed. In other words, switch assemblies $SW_2$, $SW_3$, —, $SW_m$ are provided with the switching means corresponding to lead terminals $Y_1$, $Y_2$, —, $Y_n$ and the switch circuits which actuate said switching means.

The emitters of the transistors of the switch circuits are grounded through common emitter resistor RD and the collectors of the transistors are connected to common connection line $L_1$.

Auxiliary switch circuit 10 comprises a pair of NPN type transistors 11 and 12 and the base of transistor 10 is connected to said common connection line $L_1$. The collector of transistor 11 is directly connected to power supply E and the collector of transistor 12 is connected to power supply E through collector load resistor 13. The collector of transistor 11 is grounded through fixed resistors 14 and 15 which are connected in series and the base of transistor 12 is connected to the connection points of these fixed resistors. Accordingly, the fixed bias due to the emitter current of transistor 11 is applied to the base of transistor 12. The emitter of transistor 12 is grounded through said common emitter resistor RD. In other words, the emitters of transistors $TA_1$, $TA_2$, —, $TA_n$ of the switch circuits and transistor 12 of the auxiliary switch circuit are connected in parallel. The collector of transistor 12 is connected to control signal output terminal 16.

Figure 2:
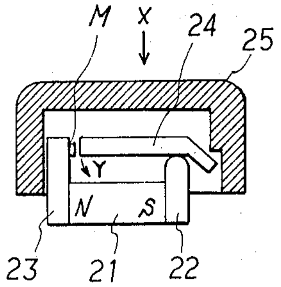
FIG. 2 is a cross sectional view illustrating an embodiment of a key switch means to be employed in the apparatus in accordance with the present invention.

When the magnetro-resistance effect devices are employed as semiconductor resistance varying elements $M_1$, $M_2$, —, $M_n$, a key switch is formed as shown in FIG. 2.

Pole members 22 and 23 such as ferrite are fixed to both poles N and S of permanent magnet 21 and an end of moving yoke 24 made of magnetic material which is supported by one pole member 22 is opposed to other pole member 23. A magnetro-resistance effect device M is fixed at a position, which can be opposed to said moving yoke, on pole member 23. Push button 25 is formed to cover said moving yoke and to contact and move the moving yoke when said push button is depressed.

When push button 25 is not depressed, moving yoke 24 is opposed to magnetro-resistance effect device M and a strong magnetic field acts on the magnetro-resistance effect device. Accordingly, the resistance value of the magnetro-resistance effect device is large.

When push button 25 is depressed in a direction indicated with an arrow X, moving yoke 24 rotates in reference to the contact point of the moving yoke and pole member 22 as shown with arrow Y in the figure, the intensity of the magnetic field acting on the magnetro-resistance effect device abruptly decreases and the resistance value of the magnetro-resistance effect device becomes extremely small.

The following describes the operation of the circuit shown in FIG. 1 which is designed so that the semiconductor resistance varying element functions and the resistance value is reduced when said push button, that is, the key is operated.

In switch circuits $S_1$, $S_2$, —, $S_n$, transistors $TA_1$, $TA_2$, —, $TA_n$ are not conductive since the bias voltages of the bases of the transistors which are set by bias circuits $B_1$, $B_2$, —, $B_n$ when the resistance value of the corresponding resistance varying elements is high, that is, the key is not operated. Transistors 11 and 12 of auxiliary switch circuit 10 are conductive.

When a certain specified key switch which corresponds to a certain specified lead terminal of line X and a certain specified lead terminal of row Y such as, for example, the key switch which corresponds to switching means $ST_1$ which opens and closes the circuit between lead terminal $X_1$ and lead terminal $Y_1$ is depressed, the internal resistance value of semiconductor resistance varying element $M_1$ becomes small, the bias potential increases and transistor $TA_1$ becomes conductive.

At this time, the current flows from power supply E to emitter resistor RD through collector resistor $RC_1$ and also flows from power supply E to emitter resistor RD through resistor RE and diode $D_1$. Accordingly, the collector potential of transistor $TA_1$ is lowered and switching means $ST_1$ is made conductive. In other words, output lead terminal $X_1$ of ring counter 101 and input lead terminal $Y_1$ of comparator 102 shown in FIG. 18 are shorted. Transistor 11 of auxiliary switch circuit 10 becomes non-conductive, the base potential of transistor 12 is lowered and transistor 12 becomes also non-conductive. Thus, the control signal is obtained from output terminal 16.

Hereupon, transistor $TA_1$ of switch circuit $S_1$ and transistor 12 of the auxiliary switch circuit are grounded through common emitter resistor RD, and these two transistors are considered to form a type of Schmitt trigger circuit since they function reversely. Accordingly, switch circuit $S_1$ is given a hysteresis characteristic against variation of the resistance of semiconductor resistance varying element $M_1$ by auxiliary switch circuit 10. Therefore, the chattering when the key is depressed can be prevented. In other words, the switching means operates stably since the switch circuits do not operate with irregular variation of resistance of the semiconductor resistance varying elements at the initial timing of depression of the key.

Figure 3:
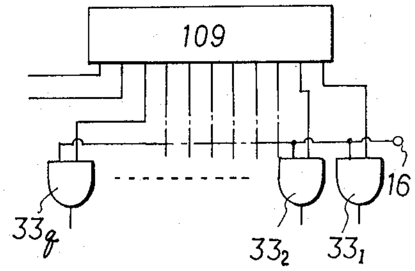
FIG. 3 is a circuit diagram of an auxiliary switch circuit to be employed in the apparatus according to the present invention in which the output signal of said auxiliary switch circuit is used as a strobe signal.

As described above, auxiliary switch circuit 10 is provided to cause the switch circuits to have the hysteresis characteristic. The signal is output terminal 16 in accordance with operation of the switch circuits and can be used as the strobe signal. FIG. 3 shows an example of application. The output from output terminals $P_1$, $P_2$, —, $P_1$ of output driver 109 is applied to one-side input terminals of AND circuits $33_1$, $33_2$, —, $33_q$ and the control signal from output terminal 16 of auxiliary switch circuit 10 is applied as the strobe signal to the other-side input terminal of said AND circuits.

Figure 4A:
FIGS. 4A to 4D are respectively a waveform diagram illustrating the operation of the circuit shown in FIG. 3.
Figure 4B:
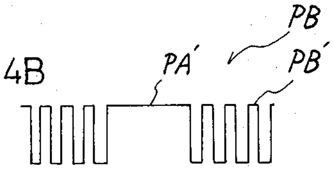
Figure 4C:
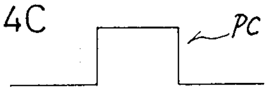
Figure 4D:
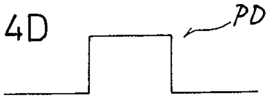

When a specified key is depressed, the switch circuit corresponding to the key generates signal PA shown in FIG. 4A and output driver 109 generates signal PB, as shown in FIG. 4B, containing signal PA′ corresponding to signal PA and clock pulse PB′ from the ring counter. Since the strobe input is signal PC corresponding to signal PA of the switch circuit as shown in FIG. 4C, data output signal PD which does not contain clock pulse PB′ as shown in FIG. 4D is obtained from the output terminal of the AND circuits.

In the embodiment shown in FIG. 1, the keyboard switch apparatus is adapted so that each switch circuit of all switch circuits which are considered one switch circuit group is connected to a single auxiliary switch circuit. However, all switch circuits of the keyboard apparatus need not be combined with a single auxiliary switch circuit, and all switch circuits can be divided into a plurality of groups and the switch circuits of each group can be connected to a single auxiliary switch circuit. For example, the switch circuits corresponding to the numerical keys of the keyboard are classified as one group and the switch circuits corresponding to the character keys are classified as one group thereby one auxiliary switch circuit can be provided for each group.

Either in the case that all switch circuits are classified as one switch circuit group or in the case that all switch circuits are divided into a plurality of switch circuit groups, one auxiliary switch circuit is provided for one switch circuit group.

Figure 5:
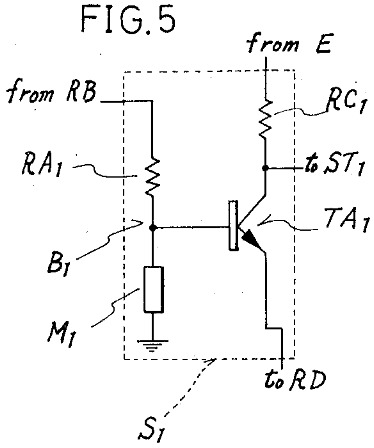
FIG. 5 is a circuit diagram illustrating an embodiment of the switch circuit.

FIG. 5 shows another embodiment of the bias circuit of each switch circuit. In the figure, the embodiment with respect to switch circuit $S_1$ only, and it is the same as for other switch circuits.

Bias circuit $B_1$ comprises fixed resistor $RA_1$ and semiconductor resistance varying element $M_1$ which are connected in series, and the base of transistor $TA_1$ is connected to the connecting point between said resistor and element. Said fixed resistor $RA_1$ is connected to current limiting resistor RB side and one end of said semiconductor resistance varying element $M_1$ is grounded as if fixed resistor $RA_1$ and semiconductor resistance varying element $M_1$ shown in the embodiment of FIG. 1 are exchanged in connection.

Figure 6:
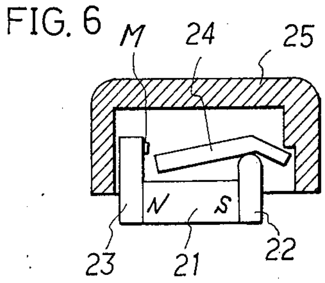
FIG. 6 is a cross sectional view illustrating an embodiment of a key switch means.

In this case, the key switches are adapted so that internal resistance of the semiconductor resistance varying element increases when the key or the push button is depressed, the base potential of transistor $TA_1$ increases in accordance with increase of the resistance value of the semiconductor resistance varying element and the transistor becomes conductive. If the magnetro-resistance effect device is employed as the semiconductor resistance effect device, the key switches can be adapted, as shown in FIG. 6, so that moving yoke 24 is not opposed to magnetro-resistance effect device M when push button 25 is not depressed and moving yoke 24 moves to oppose to element M when push button 25 is depressed whereby the magnetic flux of the closed magnetic circuit formed by magnet 21, pole member 22, moving yoke 24 and pole member 23 is applied to element M.

Diodes $D_1$, $D_2$, —, $D_n$ are connected in the forward direction from switch circuits $S_1$, $S_2$, —, $S_n$ to auxiliary switch circuit 10, and the switch circuits can be actuated in the reverse logic. In other words, the switch circuits can be adapted so that transistors $TA_1$, $TA_2$, —, $TA_n$ are conductive when the keys are not operated and the corresponding transistors are not conductive when the keys are operated. However, in this configuration, the transistors of all switch circuits of the keyboard switch apparatus are conductive when the keys are not operated and the power consumption becomes large. Accordingly, this configuration is undesirable.

Figure 7:
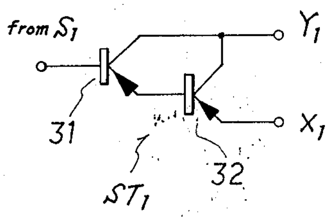
FIG. 7 is a connection diagram illustrating an embodiment of a switching means.

FIG. 7 shows another embodiment of the switching means. Switching means $ST_1$ employs a circuit in which a pair of transistors 31 and 32 are Darlington-connected instead of the switching element such as MOS transistor, etc. In this circuit, the base of transistor 31 is connected to the collector of transistor $TA_1$ of switch circuit $S_1$, the emitter of transistor 32 to lead terminal $X_1$ and the collector of transistor 32 to lead terminal $Y_1$. If the type of the circuit is employed as the switching means, the impedance between lead terminals $X_1$ and $Y_1$ is extremely large as seen from the base of transistor 31 and therefore the impedance relationship between the switch circuit and the lead terminal can be ignored.

Figures 8, 9:
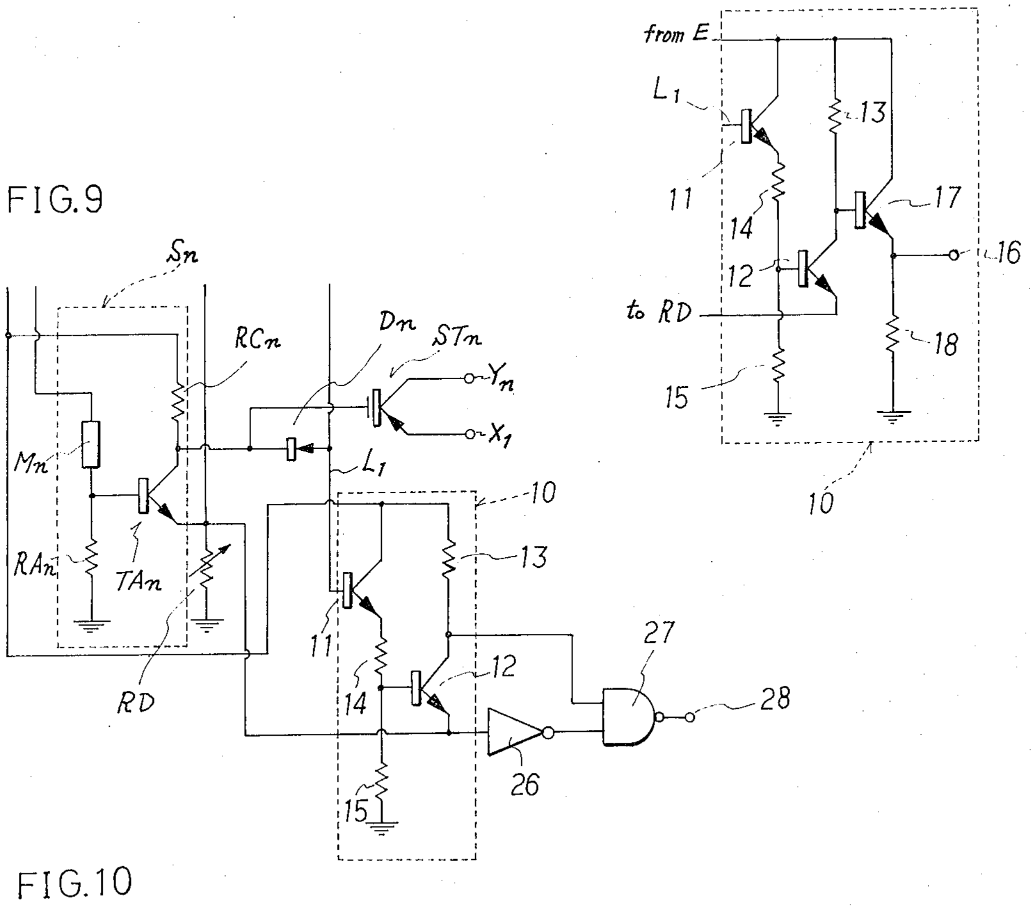
FIG. 8 is a circuit diagram illustrating an embodiment of an auxiliary switch circuit.
FIG. 9 is a partial circuit diagram illustrating an embodiment in case that the output signal of the auxiliary switch circuit is used as a double keying prevention signal.

FIG. 8 shows another embodiment of the auxiliary switch circuit. The base of NPN transistor 17 is connected to the collector of transistor 12 and the emitter of said transistor is grounded through resistor 18. Output terminal 16 is provided at the emitter of transistor 17. In this circuit, the impedance conversion is performed and the output impedance becomes small.

FIG. 9 shows an embodiment in which the control signal obtained from auxiliary switch circuit 10 is provided with the double keying prevention function. The voltage across both ends of common emitter resistor RD is taken up from the emitter of transistor 12 of auxiliary switch circuit 10 and applied to NAND circuit 27 through inverter 26 as the input. On the other hand, the signal from the collector of transistor 12 of auxiliary switch circuit 10 is also input into said NAND circuit.

In this configuration, if more than two keys are erroneously depressed and the transistors of more than two switch circuits are conductive, the current flowing in common emitter resistor RD increases and the voltage across both ends of the emitter resistor increases. Since this signal is reversed and input into NAND circuit 27, the control signal cannot be obtained at terminal 28 provided at the output side of NAND circuit 27.

Accordingly, erroneous operation due to double keying can be eliminated by using a signal from terminal 28 as the strobe signal.

Figure 10:
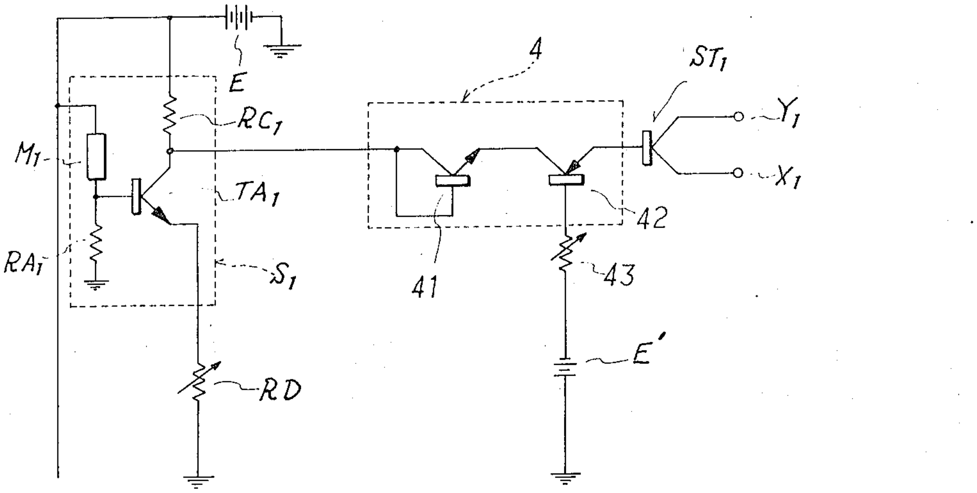
FIGS. 10 to 14 are a partial circuit diagram illustrating an embodiment in which a control circuit is provided between each switch circuit and each switching means and said control circuit is energized by the second power supply.

Referring to FIG. 10, there is shown an embodiment in which control circuit 4 is provided between switch circuit $S_1$ and switching means $ST_1$ and is energized by power supply E′ different from power supply E for said switch circuits.

Control circuit 4 comprises an NPN type self-biasing transistor whose collector and base are connected and a PNP type transistor 42 whose collector is connected to the emitter of transistor 41; the collector of said transistor 41 is connected to the collector of transistor $TA_1$ of switch circuit $S_1$ and the emitter of transistor 42 is connected to the base of switching means $ST_1$ comprised of the PNP type transistor. The base of transistor 42 is connected to DC negative power supply E′ through adjust resistor 42.

In this circuit, when transistor $TA_1$ of the switch circuit is non-conductive, transistor 41 is conductive. Accordingly, the current circuit passing through power supply E to collector resistor $RC_1$, the collector and base of transistors 41 and 42, resistor 43 and power supply E′. Since power supply E′ is negative, the potential of the collector of transistor 42 becomes equal or approximate to the grounding potential. Since the base bias of transistor $ST_1$ as the switching means is small, transistor $ST_1$ does not become conductive and the circuit between lead terminals $X_1$ and $Y_1$ is not shorted.

When the key corresponding to switch circuit $S_1$ is depressed and transistor $TA_1$ is conductive, transistor 41 becomes non-conductive and therefore the negative potential of power supply E′ is greatly applied to the base of transistor $ST_1$ to cause transistor $ST_1$ to become conductive and the circuit between lead terminals $X_1$ and $Y_1$ is shorted.

Thus, operation of switching means $ST_1$ is not controlled with the potential of power supply E and is controlled with the potential of the second power supply E′ and accordingly the bias potential setting range can be set large.

Figures 11, 12:
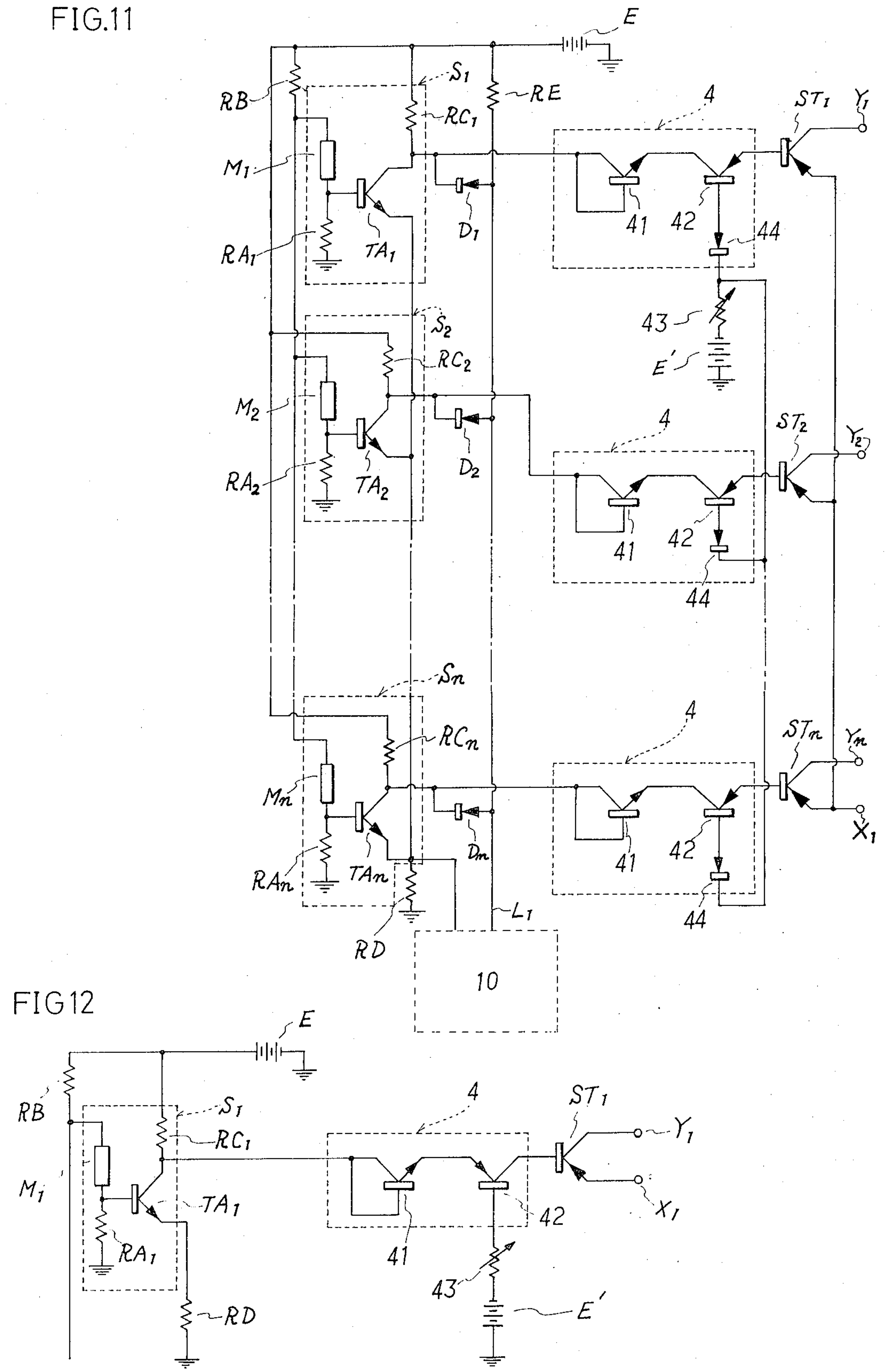

As a matter of course, the control circuits can be provided respectively between all switching means and all switch circuits. In this case, common negative power supply E′ can be used for transistor 42 of each control circuit as shown in FIG. 11. That is, diodes 44 can be provided between adjust resistor 43 and transistors 42 in the forward direction from these transistors to the negative pole of power supply E′. Transistor 42 similarly operate if its emitter and collector are reversely connected as shown in FIG. 12.

Figure 13:
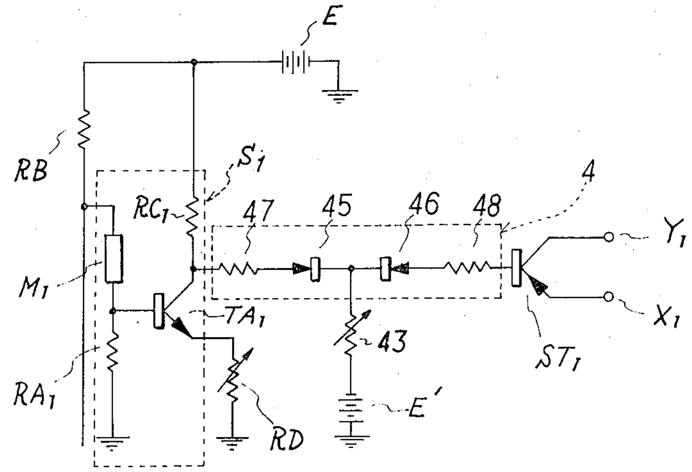

FIG. 13 shows an embodiment in which control circuit 4 is formed with the diodes and resistors.

The reverse direction electrodes of diodes 45 and 46 are connected to adjust resistor 43, the forward direction electrode of diode 45 is connected to the collector of transistor $TA_1$ of the switch circuit through resistor 47 and the forward direction electrode of diode 46 is connected to the base of transistor $ST_1$ as the switching means through resistor 48. In other words, both diodes 45 and 46 are connected to the adjust resistor in the forward direction toward the negative pole of negative power supply E′. In this configuration, when transistor $TA_1$ is conductive, diode 45 becomes off and the negative voltage of power supply E′ is applied to the base of transistor $ST_1$ as the switching means.

Figure 14:
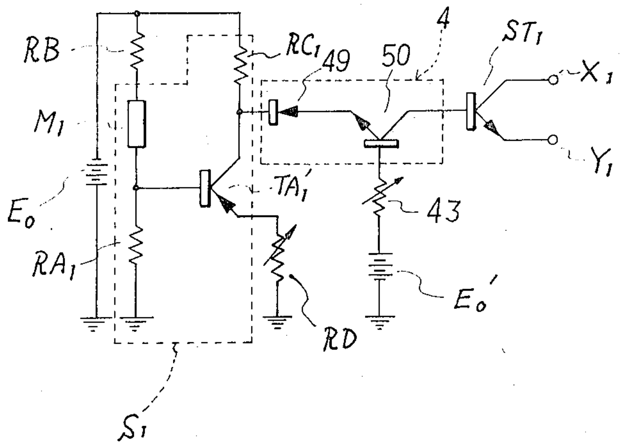

FIG. 14 shows an embodiment of switch circuit $S_1$ and control circuit 4 in case that switch circuit $S_1$ is adapted to have reverse logic.

A PNP type transistor is employed as transistor $TA'_1$ of switch circuit $S_1$ and is adapted so that the resistance value of semiconductor resistance varying element $M_1$ is small when the key is not operated and large when the key is operated and transistor TA′1 becomes conductive. Power supply $E_o$ of switch circuit $S_1$ is a negative power supply while power supply $E_o'$ of control circuit 4 is a positive power supply.

Control circuit 4 comprises diode 49 and NPN type transistor 50. The collector of transistor 50 is connected to the base of transistor $ST_1$ as the switching means and the emitter of transistor 50 is connected to the collector of transistor $TA'_1$ of switch circuit $S_1$ through diode 49. Diode 49 is connected in the forward direction from transistor 50 to transistor $TA'_1$. The positive pole of power supply $E_o'$ is connected to the base of transistor 50 through adjust resistor 43. In this circuit, when transistor $TA'_1$ becomes conductive, diode 49 becomes off and the positive voltage of power supply $E_o'$ is applied to the base of transistor $ST_1$.

Thus, in the embodiments shown in FIGS. 10 to 14, control circuit 4 is energized by the second power supply having the polarities opposite the first power supply which energizes said switch circuits. The control circuit has a pair of semiconductor elements, one of which performs switching operation in accordance with variation of the output voltage of the switch circuit. The current circuit in which the first and second power supplies are series-connected is formed when said one of semiconductor elements is open and the voltage of the second power supply is applied to the switching means through the other of semiconductor elements said one of semiconductor elements is closed. Accordingly, the operation of the switching means is controlled by the power supply of control circuit 4, that is, the second power supply and therefore the bias potential of the switching means is varied without no direct relation to variation of the output voltage of the switch circuit. Accordingly, the bias potential of the switching means can be provided with a sufficient allowance and the switching means can be accurately operated even though the output signal of the switch circuit is small.

Figure 15:
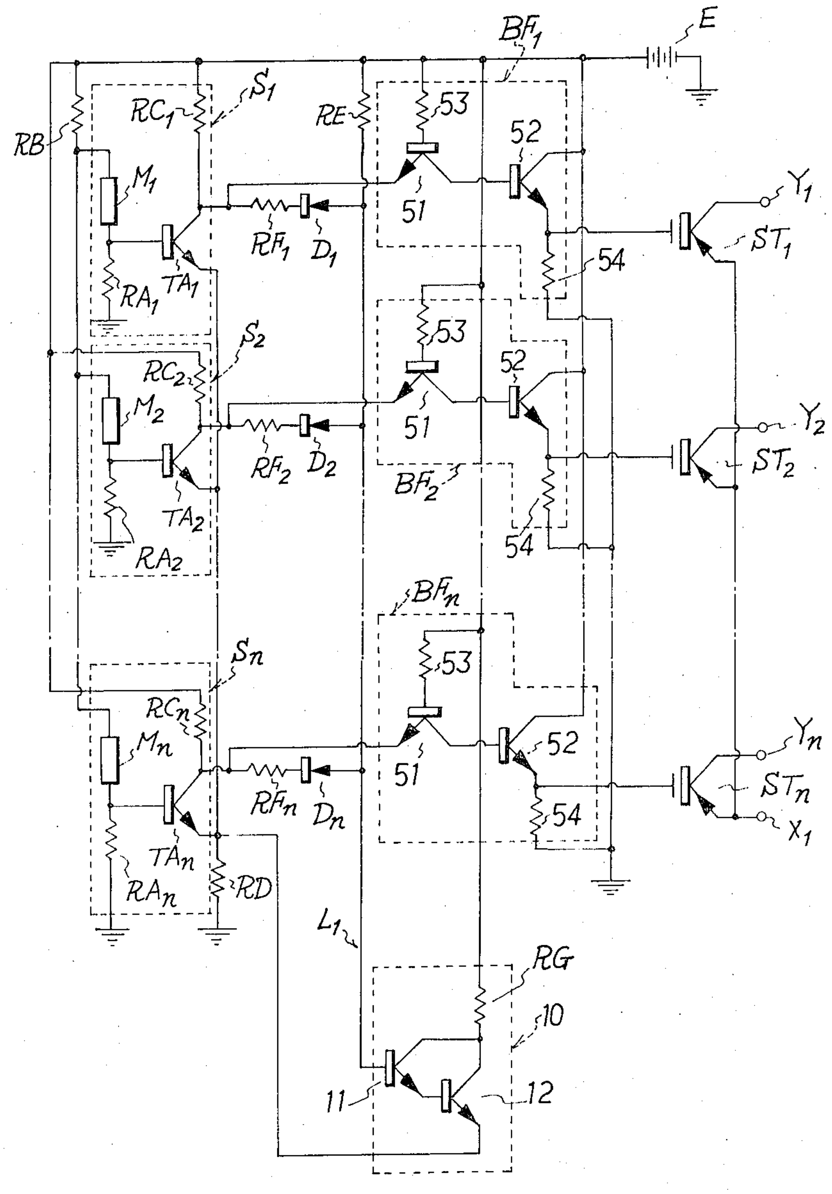
FIGS. 15 to 17 are respectively a partial circuit diagram illustrating an embodiment in which a buffer circuit is provided between each switch circuit and each switching means.

Referring to FIG. 15, there is shown an embodiment in which buffer circuits $BF_1$, $BF_2$, —, $BF_n$ are respectively connected between switch circuits $ST_1$, $ST_2$, —, $ST_n$ and switch circuits $S_1$, $S_2$, —, $S_n$. Said buffer circuits have similar functions to the aforementioned control circuit 4 but employ the same power supply as the power supply of the switch circuits, different from said control circuit. Each buffer circuit is provided with a pair of active elements such as, for example, NPN type transistor 51 and 52. The bases of transistors 51 are connected respectively to power supply E through adjust resistors 53, the emitters are connected to the collectors of transistors $TA_1$, $TA_2$, —, $TA_n$ of switch circuits $S_1$, $S_2$, —, $S_n$ and the collectors are connected to the bases of transistors 52. The collectors of transistors 52 are connected to power supply E and the emitters are grounded through emitter resistors 54. The emitters of transistors 52 are further connected to the drains of MOS type transistors $ST_1$, $ST_2$, —, $ST_n$ as said switching means.

In this circuit, when the key corresponding to switch circuit $S_1$ is not operated, that is, when transistor $TA_1$ of switch circuit $S_1$ is in a non-conductive state, transistor 51 is not conductive and transistor 52 is conductive. When the key is operated and transistor $TA_1$ becomes conductive, the collector potential of transistor $TA_1$, that is, the emitter potential of transistor 51 is lowered, transistor 53 becomes conductive, transistor 52 becomes non-conductive, the drain potential of MOS transistor $ST_1$ is lowered and MOS transistor $ST_1$ becomes conductive. In other words, lead terminals $X_1$ and $Y_1$ are shorted.

In FIG. 15, auxiliary switch circuit 10 which is formed by Darlington-connecting transistors 11 and 12 is employed. The collectors by transistors $TA_1$, $TA_2$, —, $TA_n$ of the switch circuits are connected to the base of transistor 11 through resistors $RF_1$, $RF_2$, —, $RF_n$ and diodes $D_1$, $D_2$, —, $D_n$, the emitter of transistor 12 is connected to the emitters of the transistors of the switch circuits and the collectors of transistors 11 and 12 are connected to power supply E through resistor RG.

Figure 16:
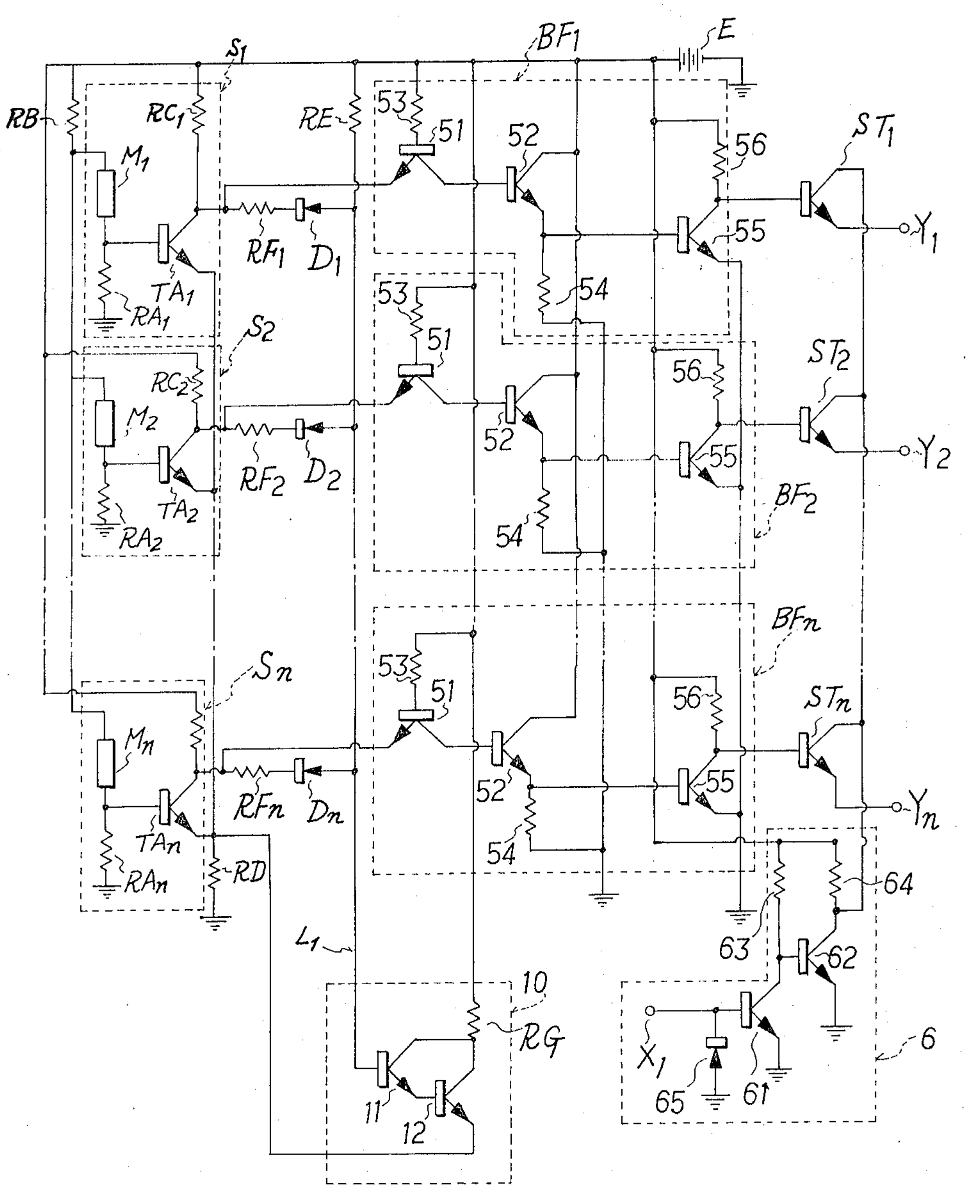

Referring to FIG. 16, there is shown an embodiment of buffer circuits $BF_1$, $BF_2$, —, $BF_n$ in which NPN type transistors $ST_1$, $ST_2$, —, $ST_n$ are employed as the switching means. This circuit is formed by connecting the active elements such as, for example, NPN type transistors 55 to the buffer circuits shown in FIG. 15. The base of each transistor 55 is connected to the emitter of transistor 52, the collector to power supply E through collector load resistor 56 and the emitter is grounded. The collector of transistor 56 is connected to the bases of NPN type transistor $ST_1$, $ST_2$, —, $ST_n$ as the switching means.

Furthermore, pulse input amplifying circuit 6 is provided between lead terminal $X_1$ and the collectors of NPN type transistors $ST_1$, $ST_2$, —, $ST_n$ and the emitters of said transistors $ST_1$, $ST_2$, —, $ST_n$ are connected respectively to lead terminals $Y_1$, $Y_2$, —, $Y_n$.

Said amplifying circuit 6 is comprised of a pair of NPN type transistors 61 and 62 whose emitters are grounded and collectors are connected to the power supply through resistors 63 and 64, and lead terminal $X_1$ is connected to the base of transistor 61 and, at the same, is grounded through diode 65 provided in the forward direction from the grounding side to lead terminal $X_1$. Furthermore, the collector of transistor 61 is connected to the base of transistor 61. The collector of transistor 62 is connected to the collector of transistors $ST_1$, $ST_2$, —, $ST_n$ as the switching means.

In this embodiment, when the key corresponding to switch circuit $S_1$ is operated, transistor $TA_1$ of switch circuit $S_1$ becomes conductive, transistor 51 of buffer circuit $BF_1$ becomes conductive, transistor 52 becomes non-conductive and transistor 55 becomes non-conductive, thereby the collector potential of transistor 55, that is, the base potential of transistor $ST_1$ as the switching means increases and transistor $ST_1$ becomes conductive. At this time, the pulses applied from ring counter 101 shown in FIG. 18 to lead terminal $X_1$ are amplified by amplifying circuit 6 and sent to lead terminal $Y_1$.

Figure 17:
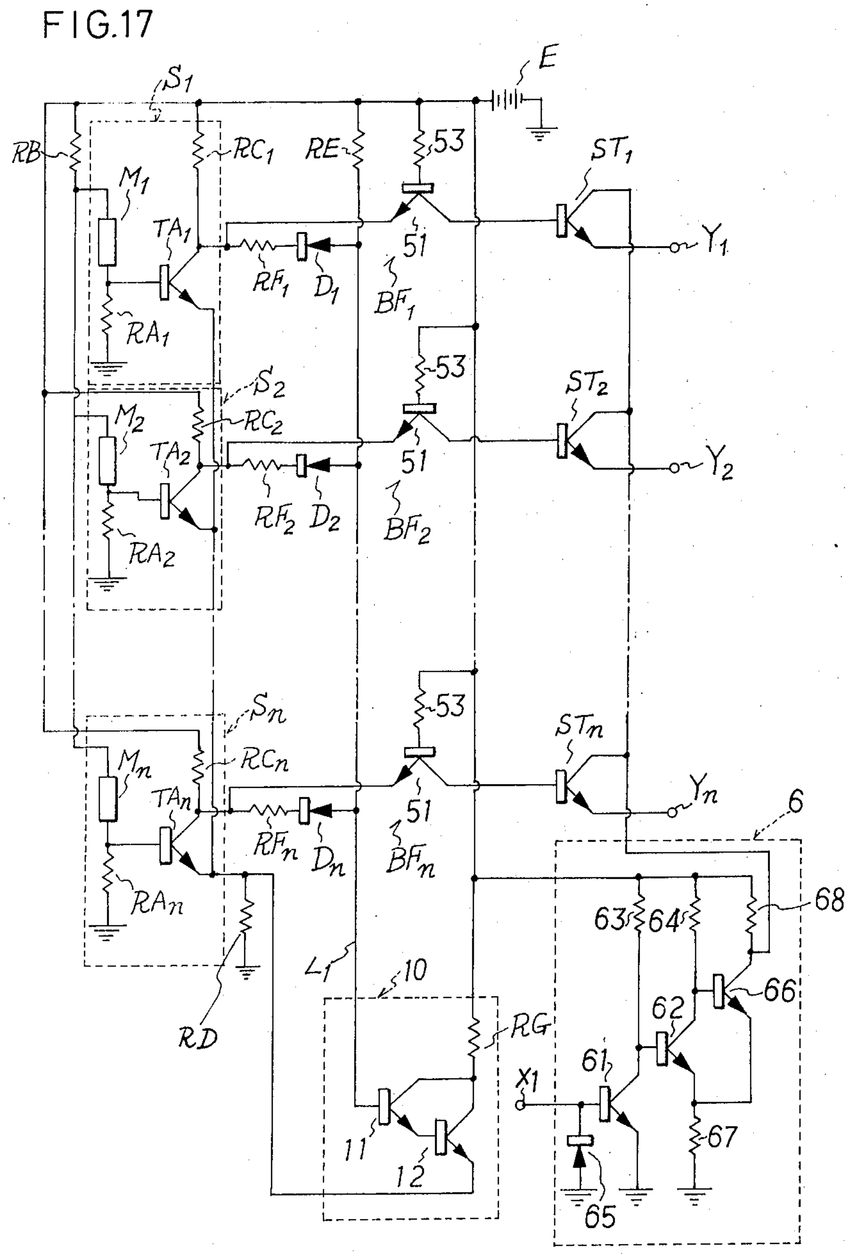

Referring to FIG. 17, there is shown an embodiment in which the switching means operates in negative logic, that is, the switching means is always conductive and, when a specified key switch is operated, the corresponding switching means becomes non-conductive.

In this embodiment, buffer circuits $BF_1$, $BF_2$, —, $BF_n$ are such that transistors 52 and 53 are removed respectively from the buffer circuits shown in FIG. 16 and the collectors of transistors 51 are connected to the bases of transistors $ST_1$, $ST_2$, —, $ST_n$ as the switching means.

Accordingly, when transistor $TA_1$ of switch circuit $S_1$ is conductive and transistor 51 becomes conductive, the base potential of transistor $ST_1$ is lowered and transistor $ST_1$ becomes non-conductive.

Amplifying circuit 6 is provided with the functions of said embodiment, that is, the functions of the amplifying circuit shown in FIG. 16, plus the signal reversing function. Transistor 66 forming the Schmitt trigger circuit in combination with transistor 62 is added to said amplifying circuit. The base of transistor 66 is connected to the collector of transistor 62, the emitter is connected to the emitter of transistor 62 and is grounded through common emitter resistor 67, and the collector is connected to power supply E through load resistor 68. The collector of transistor 66 is connected to the collectors of transistors $ST_1$, $ST_2$, —, $ST_n$ as the switching means. In this configuration, the signal input from lead terminal $X_1$ is reversed by transistors 61, reversed by transistor 62 and reversed by transistor 66.

As described above, the apparatus in accordance with the present invention comprises the switch circuits which are given the hysteresis characteristic by providing the auxiliary switch circuit, which is commonly connected, at the switch circuits of the switch circuit group. Therefore, the chattering when the keys are depressed can be avoided and the circuit configuration can be simplified since the auxiliary switch circuit can be integrally provided.

Since said auxiliary switch circuits generate the control signal when one of keys is depressed, this signal can be utilized as the strobe signal. In other words, no other strobe signal generating circuit is required.

Furthermore, said strobe signal can be used as the double keying prevention signal.

What is claimed is:

1. A keyboard switch apparatus comprising a. at least one switch circuit group comprised of a plurality of switch circuits which are respectively provided with a semiconductor resistance varying element and an active element which operates in accordance with variation of internal resistance of said semiconductor resistance varying element and respectively provide an output voltage which varies in accordance with variation of the resistance of said semiconductor resistance varying element, b. a first power supply which energizes said switch circuits, c. a plurality of key switch means, each being adapted to be operated manually to vary the internal resistance of said semiconductor resistance varying element, d. a plurality of switching means, each being adapted to perform switching operation according to variation of the output voltage of said switch circuit, and e. an auxiliary switch circuit which has at least one active element, is connected in common to the switch circuits of said switch circuit group and functions to provide a hysteresis characteristic in variation of the output voltage of said switch circuits.

2. An apparatus in accordance with claim 1, wherein a reference electrodes of the active element of said auxiliary switch circuit is connected to reference electrodes of the active elements of said switch circuits, these electrodes are grounded through a common load means and the active element of said auxiliary switch circuit, when the active element of at least one switch circuit connected to said auxiliary switch circuit functions, functions reverse to the active element of said switch circuit.

3. An apparatus in accordance with claim 2, wherein each active element of said switch circuits causes said load means to be conductive when said key switch means is operated.

4. An apparatus in accordance with claim 3, wherein a signal generated from variation of a voltage across both ends of said load means is taken out through an inverter, this reverse signal and a signal due to functioning of the active elements of said auxiliary switch circuits are input into an AND circuit, an output signal is not obtained from said AND circuit when more than two switch circuits function simultaneously and a signal according to functioning of said active element of the auxiliary switch circuit is obtained from said AND circuit when a single switch circuit alone functions.

5. An apparatus in accordance with claim 2, wherein said auxiliary switch circuit is provided with said active element and another active element which functions according to the function of said active element.

6. An apparatus in accordance with claim 1, wherein said semiconductor resistance varying elements are magnetro-resistance effect devices and each of said key switch means varies the intensity of magnetic field to be applied to each of said magnetro-resistance effect devices.

7. An apparatus in accordance with claim 6, wherein the intensity of magnetic field to be applied to said magnetro-resistance effect devices becomes large when said key switch means are operated.

8. An apparatus in accordance with claim 7, wherein the intensity of magnetic field to be applied to said magnetro-resistance effect devices becomes small when said key switch means are operated.

9. An apparatus in accordance with claim 1, wherein said switching means are MOS transistors.

10. An apparatus in accordance with claim 1, wherein said switching means are bipolar transistors.

11. An apparatus in accordance with claim 1, wherein said switching means are the circuits which are respectively formed by Darlington-connecting a pair of transistors.

12. An apparatus in accordance with claim 1, wherein each of control circuits is provided between said switch circuit and switching means and said control circuits are adapted to be energized by the second power supply having the polarities reverse to the first power supply and to be controlled by the voltage from the second power supply so that said switching means becomes conductive when said switch circuit functions.

13. An apparatus in accordance with claim 12, wherein said control circuit is provided with the first semiconductor element which is connected between said second power supply and said switching means and the second semiconductor element which is connected between said switch circuit and said first semiconductor element, the second semiconductor element is conductive and therefore the current circuit containing the first and second power supplies being series-connected is formed when said key switch means is not operated, and the second semiconductor element is non-conductive due to variation of the output voltage of the switch circuits, the voltage of said second power supply is applied to said switching means through said first semi-conductor element and said switching means is switched on when said key switch means is operated.

14. An apparatus in accordance with claim 1, wherein the apparatus employing MOS transistors as said switching means and transistors as the active elements of said switch circuits is provided with buffer circuits each comprising first and second transistors and being connected between said switch circuit and the drain of said MOS transistor, first transistors being connected to the MOS transistors so that the potential of the drains of said MOS transistors is controlled in accordance with the conditions of said first transistors to switch on and off said MOS transistors and second transistors being connected so as to switch on and off said first transistors and said switch circuits in order to vary the condition of said first transistors, and said second transistors are switched on and off in accordance with variation of the output voltage of said switch circuits.

15. An apparatus in accordance with claim 1, wherein the apparatus employing transistors as said switching means and the active elements of said switch circuits is provided with buffer circuits, each comprising first, second and third transistors and being connected between the bases of the transistors of said switching means and said switch circuits, said first transistors being connected to the switching means so that switching operations of the transistors of said switching means are controlled in accordance with the condition of said first transistors, said second transistors being connected to said first transistors so that the condition of said first transistors is varied in accordance with the condition of said second transistors, and the third transistors being connected to switch on and off said second transistors and said switch circuits, whereby said third transistors are adapted so that said third transistors are switched on and off in accordance with variation of the output voltage of said switch circuits, the output voltage of said switch circuits is applied to said second transistors and the condition of the second transistors is set in accordance with variation of the output voltage of the switch circuits when the third transistors are switched on and amplifying circuits are provided between electrodes at the input signal side of two electrodes for which the transistors of said switching means are switched on and off and input lead terminals.

16. An apparatus in accordance with claim 1, wherein the apparatus employing transistors as said switching means and active elements of said switch circuits is provided with buffer circuits, each comprising an intermediate transistor which is connected between the transistors of said switching means and said switch circuits, said intermediate transistor being adapted to switch on and off the bases of the transistors of said switching means and said switch circuits, to become conductive in accordance with variation of the output voltage of said switch circuits due to operation of said key switch means and to apply the varied output voltage of said switch circuits to the bases of the transistors of said switching means, whereby amplifying and reversing circuits being adapted to amplify signals to be input into the lead terminals, to reverse said signals and to apply said reversed signals to electrodes at the input signal side of the transistors of said switching means are connected across said electrodes and said lead terminals.

* * * * *